US012631972B2

(12) United States Patent
Asakura et al.

(10) Patent No.: US 12,631,972 B2
(45) Date of Patent: May 19, 2026

(54) METHOD OF DIAGNOSING FAILURE LOCATION OF CONTROL APPARATUS, DIAGNOSTIC APPARATUS, CONTROL APPARATUS, LITHOGRAPHY APPARATUS, ARTICLE MANUFACTURING METHOD, AND NON-TRANSITORY COMPUTER-READABLE STORAGE MEDIUM

(71) Applicant: CANON KABUSHIKI KAISHA, Tokyo (JP)

(72) Inventors: Yasunobu Asakura, Tochigi (JP); Hirokazu Kusayanagi, Tochigi (JP); Takumi Hashimoto, Saitama (JP); Tomoyasu Hata, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 466 days.

(21) Appl. No.: 18/306,623

(22) Filed: Apr. 25, 2023

(65) Prior Publication Data

US 2023/0375942 A1 Nov. 23, 2023

(30) Foreign Application Priority Data

May 20, 2022 (JP) ................................. 2022-083264

(51) Int. Cl.
*G03F 7/00* (2006.01)
(52) U.S. Cl.
CPC .......... *G03F 7/70525* (2013.01); *G03F 7/709* (2013.01)

(58) Field of Classification Search
CPC .. G03F 7/70533; G03F 7/709; G03F 7/70833; G03F 7/70525
See application file for complete search history.

(56) References Cited

U.S. PATENT DOCUMENTS 5,939,625 A 8/1999 Torii et al.
9,665,012 B2 * 5/2017 Hulsebos ................ G03F 7/709
(Continued)

FOREIGN PATENT DOCUMENTS

CN 101271282 A 9/2008
CN 111226173 A 6/2020
(Continued)

OTHER PUBLICATIONS

Office action issued in Taiwanese Appln. No. 112117092 dated on Sep. 17, 2025.

*Primary Examiner* — An H Do
(74) *Attorney, Agent, or Firm* — ROSSI, KIMMS & McDOWELL LLP

(57) ABSTRACT

A method of diagnosing a failure location of a control apparatus including a plurality of actuators each configured to apply a thrust to a target object, a plurality of sensors each configured to detect a state quantity of the target object, and a controller configured to control the plurality of actuators, the method including comparing a first signal output from each of the plurality of sensors in a state in which the plurality of actuators and the plurality of sensors are considered to be normal with a second signal output from each of the plurality of sensors in a state in which the control apparatus is used, and diagnosing, as the failure location, a device including at least one of a failed actuator and a failed sensor based on a comparison result in the comparing.

13 Claims, 10 Drawing Sheets

(56)                References Cited

U.S. PATENT DOCUMENTS

| 12,140,876 B2 * | 11/2024 | Terao ................. G03F 7/70725 |
| 12,203,523 B2 * | 1/2025 | Heiniger ................ F16F 15/02 |
| 2013/0304419 A1 | 11/2013 | Nakamura et al. |
| 2023/0280240 A1 * | 9/2023 | Oka ................... G01M 99/005 |
| | | 73/865.8 |

FOREIGN PATENT DOCUMENTS

| JP | S5979317 A | 5/1984 |
| JP | H09330119 A | 12/1997 |
| JP | 2000082662 A | 3/2000 |

* cited by examiner

F I G. 2

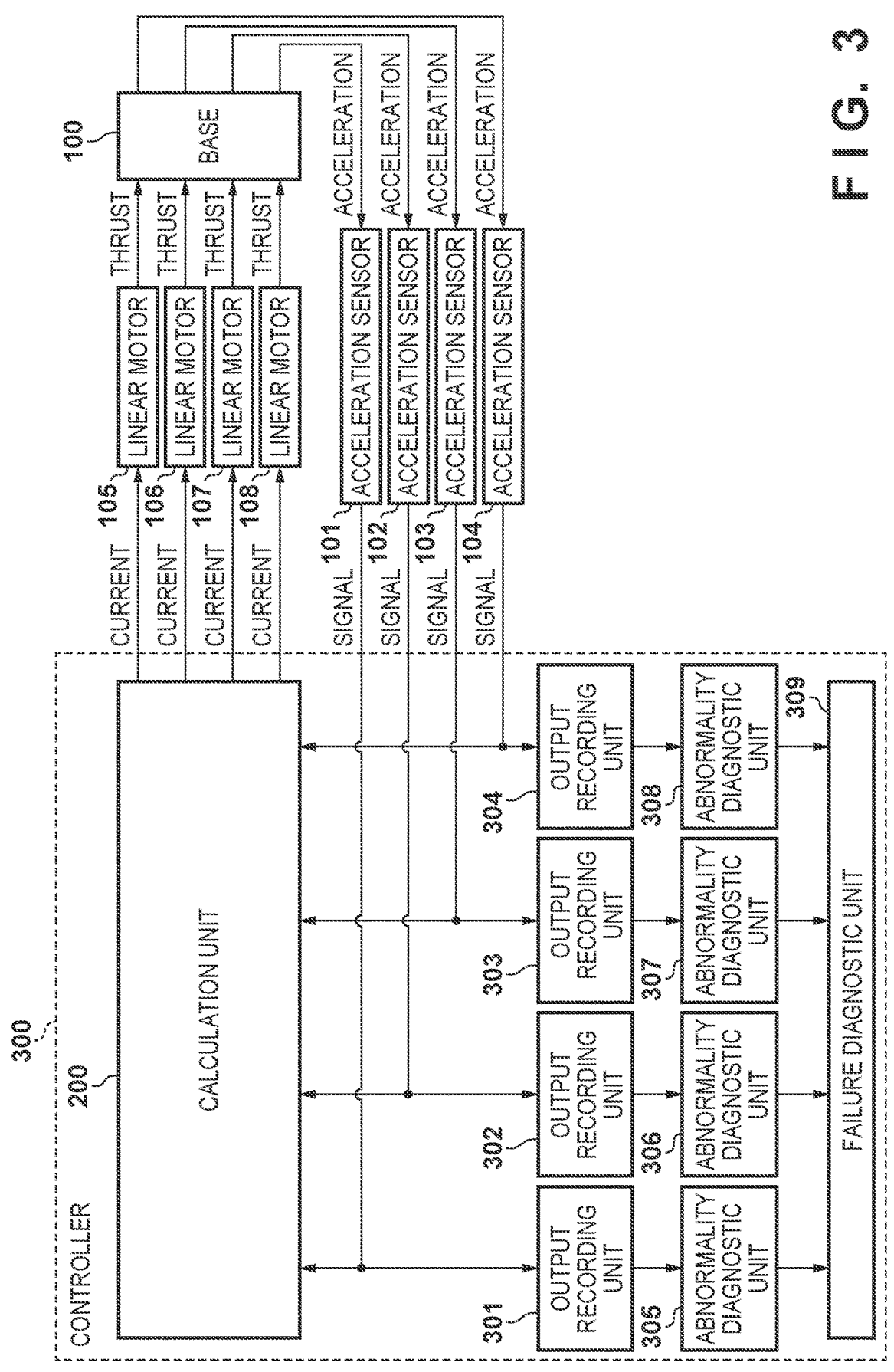
F I G. 3

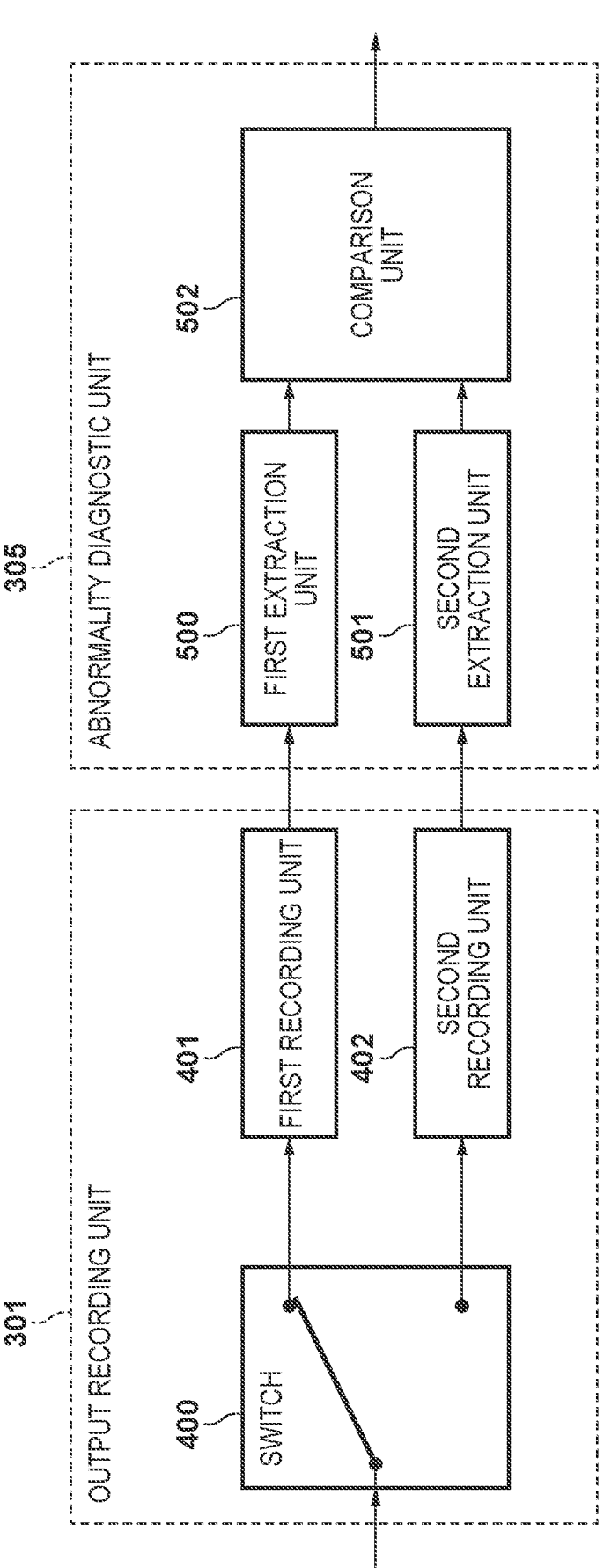
F I G. 4

FIG. 6

ABNORMALITY DIAGNOSIS PATTERN

| | ACCELERATION SENSOR 101: FAILURE $\overline{b_1}$ | ACCELERATION SENSOR 102: FAILURE $\overline{b_2}$ | ACCELERATION SENSOR 103: FAILURE $\overline{b_3}$ | ACCELERATION SENSOR 104: FAILURE $\overline{b_4}$ | LINEAR MOTOR 105: FAILURE $\overline{b_5}$ | LINEAR MOTOR 106: FAILURE $\overline{b_6}$ | LINEAR MOTOR 107: FAILURE $\overline{b_7}$ | LINEAR MOTOR 108: FAILURE $\overline{b_8}$ |
|---|---|---|---|---|---|---|---|---|
| ABNORMALITY DIAGNOSTIC UNIT 305: OUTPUT | 1 | 0 | 0 | 0 | 1 | 1 | 0 | 1 |
| ABNORMALITY DIAGNOSTIC UNIT 306: OUTPUT | 0 | 1 | 0 | 0 | 1 | 1 | 1 | 0 |
| ABNORMALITY DIAGNOSTIC UNIT 307: OUTPUT | 0 | 0 | 1 | 0 | 0 | 1 | 1 | 1 |
| ABNORMALITY DIAGNOSTIC UNIT 308: OUTPUT | 0 | 0 | 0 | 1 | 1 | 0 | 1 | 1 |

0 : NORMAL, 1: FAILURE

FIG. 7

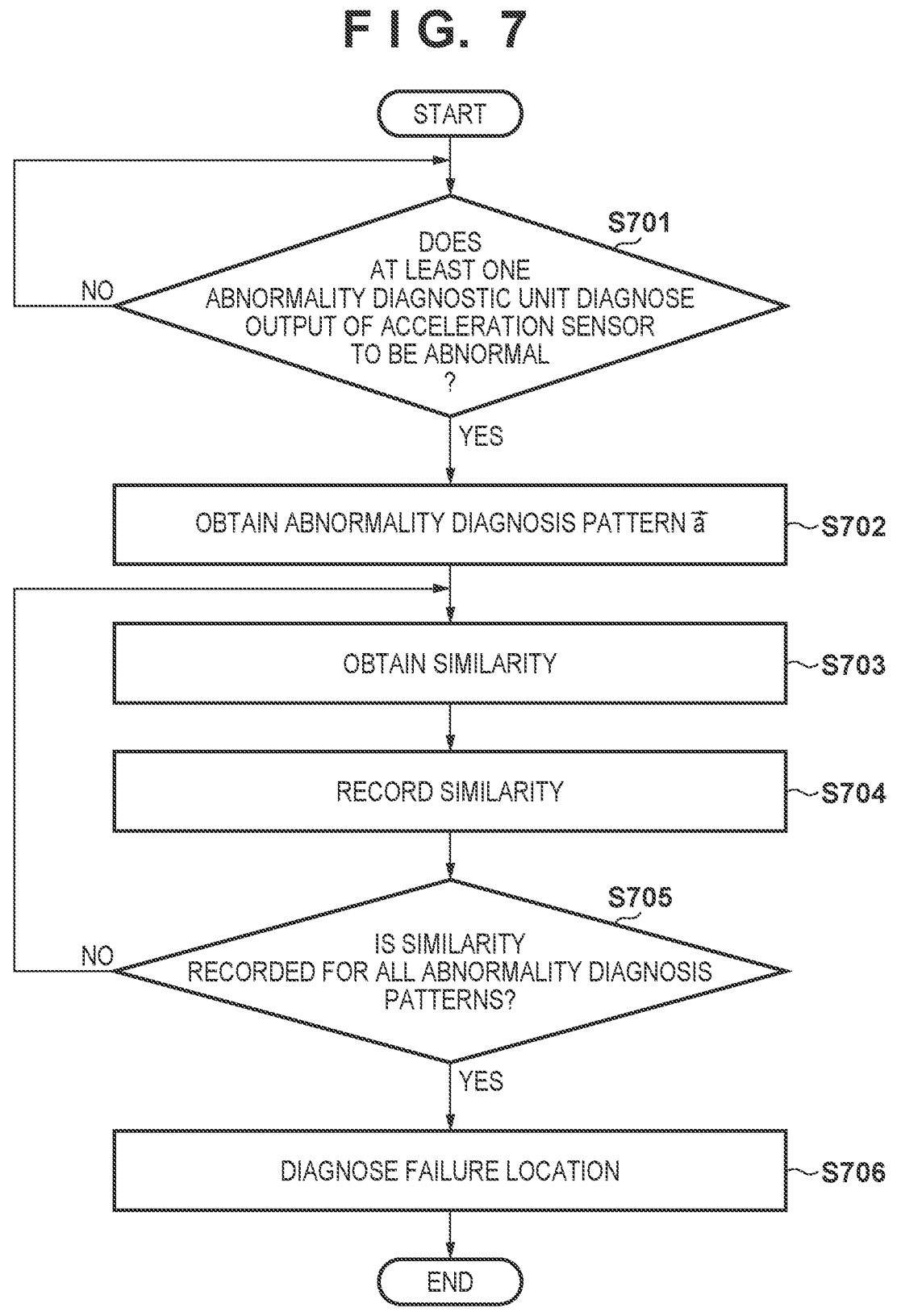

START

S701

DOES
AT LEAST ONE
ABNORMALITY DIAGNOSTIC UNIT DIAGNOSE
OUTPUT OF ACCELERATION SENSOR
TO BE ABNORMAL
?

NO

YES

OBTAIN ABNORMALITY DIAGNOSIS PATTERN $\vec{a}$    S702

OBTAIN SIMILARITY    S703

RECORD SIMILARITY    S704

S705

IS SIMILARITY
RECORDED FOR ALL ABNORMALITY DIAGNOSIS
PATTERNS?

NO

YES

DIAGNOSE FAILURE LOCATION    S706

END

METHOD OF DIAGNOSING FAILURE LOCATION OF CONTROL APPARATUS, DIAGNOSTIC APPARATUS, CONTROL APPARATUS, LITHOGRAPHY APPARATUS, ARTICLE MANUFACTURING METHOD, AND NON-TRANSITORY COMPUTER-READABLE STORAGE MEDIUM

BACKGROUND OF THE INVENTION

Field of the Invention

The present invention relates to a method of diagnosing a failure location of a control apparatus, a diagnostic apparatus, a control apparatus, a lithography apparatus, an article manufacturing method, and a non-transitory computer-readable storage medium.

Description of the Related Art

A control apparatus generally includes an actuator that applies a thrust to a target object (control target), and a sensor that measures the state quantity of the target object, and controls the state quantity of the target object by deciding the manipulated variable of the actuator in accordance with an output signal of the sensor. For example, an active anti-vibration table as one control apparatus includes a plurality of acceleration sensors provided in a base and a plurality of linear motors, and controls the acceleration of the base by deciding the manipulated variables of the linear motors based on the output signals of the acceleration sensors.

A failure of a sensor or actuator used for the control apparatus degrades the control accuracy of the target object. If the active anti-vibration table is used for an exposure apparatus, a failure of the sensor (acceleration sensor) or actuator degrades the exposure accuracy, thereby producing a defective product. Therefore, it is necessary to quickly detect (determine) a failure (failure location) of the sensor or actuator and repair it.

To achieve this, Japanese Patent Laid-Open Nos. 59-79317 and 9-330119 propose techniques for detecting a failure of a sensor or actuator used for a control apparatus. Japanese Patent Laid-Open No. 59-79317 discloses a technique of determining, by newly providing a detection unit that detects a failure of the actuator, whether the sensor or the actuator has failed. Japanese Patent Laid-Open No. 9-330119 discloses a technique of obtaining the transfer characteristics of the sensors and actuators, and estimating a failure location based on the transfer characteristics of the individual sensors and the individual actuators.

However, in the technique disclosed in Japanese Patent Laid-Open No. 59-79317, a detection unit that detects a failure of an actuator is required, thereby increasing the cost and complicating the apparatus arrangement. Furthermore, in the technique disclosed in Japanese Patent Laid-Open No. 9-330119, a target object (control target) is vibrated when obtaining the transfer characteristics, and thus the control accuracy of the target object temporarily degrades. For example, if the control apparatus is used for an exposure apparatus, a defective product is produced while the target object is vibrated, and thus the apparatus needs to be stopped, thereby reducing productivity.

SUMMARY OF THE INVENTION

The present invention provides a technique advantageous in diagnosing a failure location of a control apparatus including a plurality of actuators and a plurality of sensors.

According to one aspect of the present invention, there is provided a method of diagnosing a failure location of a control apparatus including a plurality of actuators each configured to apply a thrust to a target object, a plurality of sensors each configured to detect a state quantity of the target object, and a controller configured to control the plurality of actuators based on signals output from the plurality of sensors, the method including comparing a first signal output from each of the plurality of sensors in a state in which the plurality of actuators and the plurality of sensors are considered to be normal with a second signal output from each of the plurality of sensors in a state in which the control apparatus is used, and diagnosing, as the failure location, a device including at least one of a failed actuator and a failed sensor among the plurality of actuators and the plurality of sensors based on a comparison result in the comparing.

Further features of the present invention will become apparent from the following description of exemplary embodiments with reference to the attached drawings.

BRIEF DESCRIPTION OF THE DRAWINGS

FIG. 2 is a block diagram illustrating a procedure of deciding the manipulated variables of linear motors based on signals output from acceleration sensors.

FIG. 3 is a control block diagram of the active anti-vibration table.

FIG. 4 is a block diagram illustrating the arrangement of an output recording unit and an abnormality diagnostic unit.

FIG. 6 is a table showing an example of an abnormality diagnosis table.

FIG. 7 is a flowchart for explaining the processing of the failure diagnostic unit.

DESCRIPTION OF THE EMBODIMENTS

Figure 1:
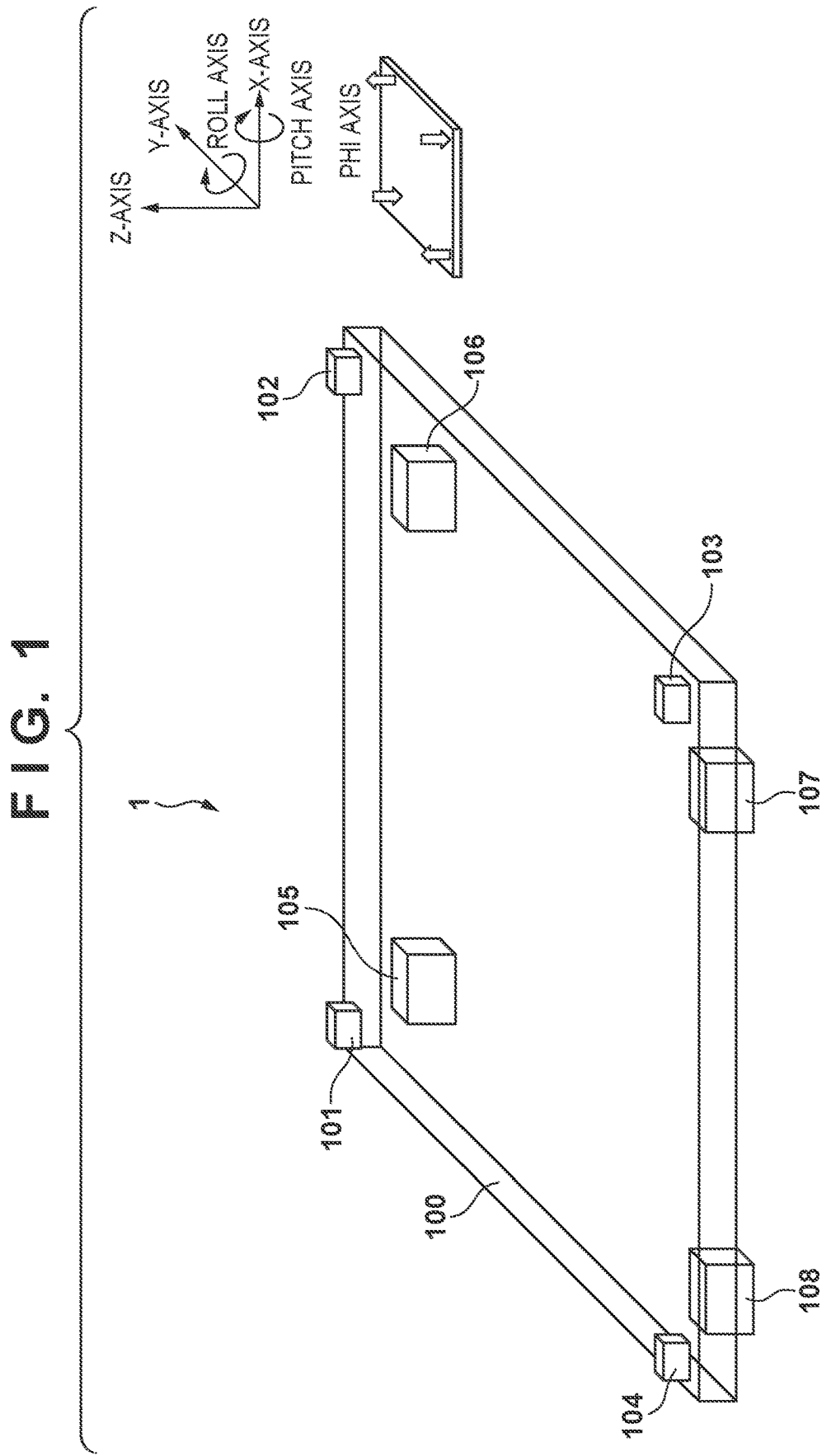
FIG. 1 is a schematic view illustrating the arrangement of an active anti-vibration table according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating the arrangement of an active anti-vibration table 1 according to an aspect of the present invention. The active anti-vibration table 1 is a control apparatus that controls four axes of a Z-axis, a pitch axis about an X-axis, a roll axis about a Y-axis, and a torsion (phi) axis.

The active anti-vibration table 1 includes a base 100, a plurality of acceleration sensors, that is, four acceleration sensors 101 to 104 in this embodiment, and a plurality of linear motors, that is, four linear motors 105 to 108 in this embodiment. The acceleration sensors 101 to 104 are provided at the four corners of the base 100, and each measure (detect) an acceleration in the Z direction of the active anti-vibration table 1 (base 100) as the state quantity of a control target (target object). Each of the linear motors 105 to 108 functions as an actuator that drives the base 100, by applying a thrust in the Z direction to the base 100.

Figure 2:
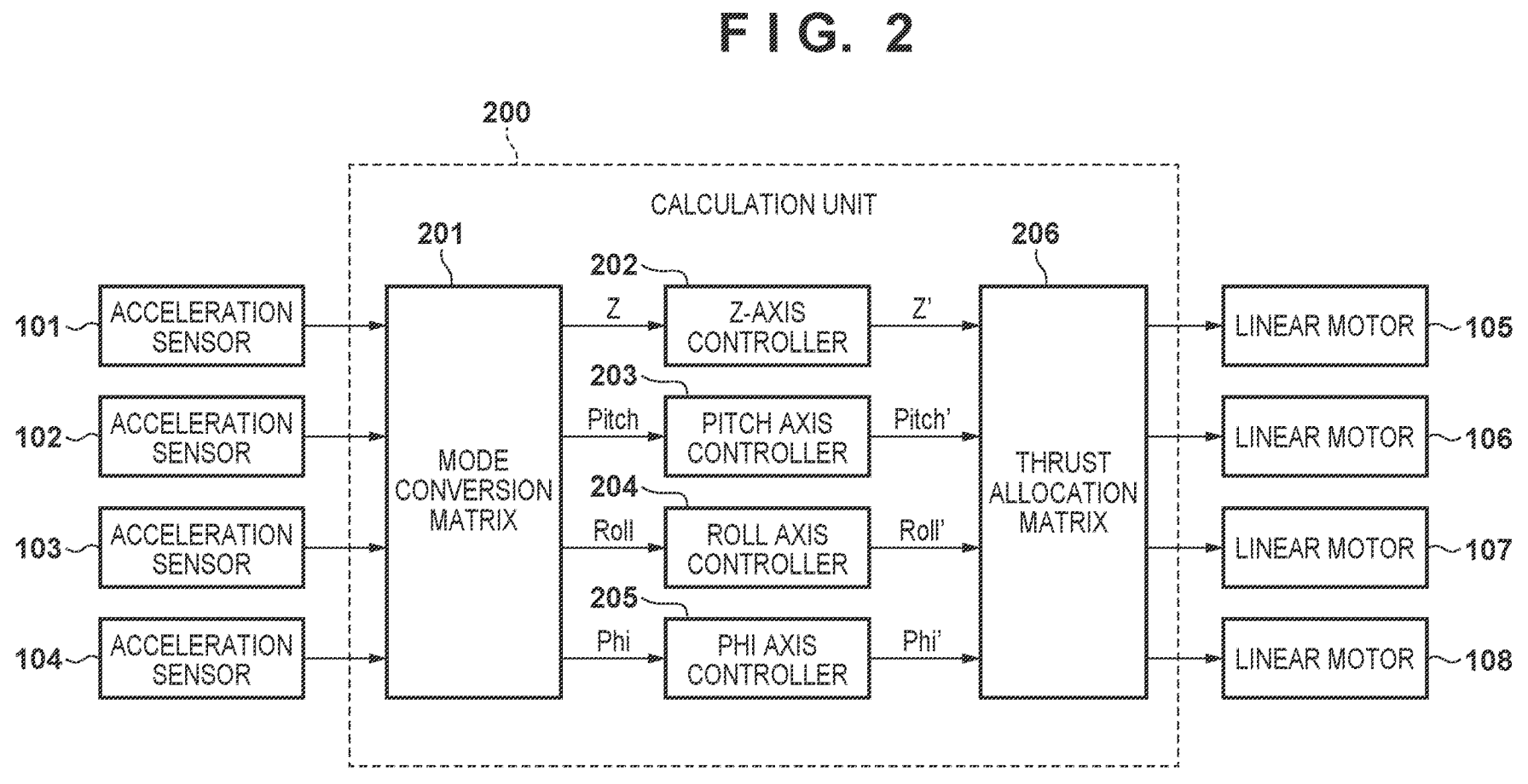

FIG. 2 is a block diagram illustrating a procedure of deciding the manipulated variables of the linear motors 105 to 108 based on signals output from the acceleration sensors 101 to 104. As shown in FIG. 2, first, each of the acceleration sensors 101 to 104 measures an acceleration in the Z direction of the active anti-vibration table 1, and inputs an output signal to a calculation unit 200. Next, the calculation unit 200 calculates accelerations with respect to the Z-axis, pitch axis, roll axis, and phi axis of the active anti-vibration table 1 via a mode conversion matrix 201 based on the output signals from the acceleration sensors 101 to 104. Next, controllers 202 to 205 associated with the respective axes, each of which includes a PID controller and a filter, decide manipulated variables Z', Pitch', Roll', and Phi' concerning the respective axes, respectively. Then, the manipulated variables Z', Pitch', Roll', and Phi' concerning the respective axes are input to a thrust allocation matrix 206 to decide the manipulated variables of the linear motors 105 to 108.

FIG. 3 is a control block diagram of the active anti-vibration table 1. A controller 300 supplies a current to each of the linear motors 105 to 108 based on the manipulated variables decided by the calculation unit 200, and each of the linear motors 105 to 108 applies a thrust to the base 100, thereby driving the base 100. The acceleration sensors 101 to 104 provided in the base 100 each measure the acceleration of the active anti-vibration table 1 (base 100), and feed back the output signal to the calculation unit 200. Note that the controller 300 also functions as a diagnostic apparatus that diagnoses a failure location of the active anti-vibration table 1 (control apparatus), as will be described later.

The accelerations (output signals) measured by the acceleration sensors 101 to 104 are respectively input to output recording units 301 to 304, and recorded in them. The accelerations recorded in the output recording units 301 to 304 are respectively input to abnormality diagnostic units 305 to 308 as signals. Each of the abnormality diagnostic units 305 to 308 diagnoses whether an abnormality of the acceleration of the active anti-vibration table 1 (base 100) is present or absent based on the signal input from a corresponding one of the output recording units 301 to 304, and inputs a diagnosis result to a failure diagnostic unit 309.

FIG. 4 is a block diagram illustrating the arrangement of the output recording unit 301 and the abnormality diagnostic unit 305. Note that each of the output recording units 301 to 304 and each of the abnormality diagnostic units 305 to 308 have the same arrangement and thus the output recording unit 301 and the abnormality diagnostic unit 305 will be exemplified. The output recording unit 301 includes a switch 400, a first recording unit 401, and a second recording unit 402. The abnormality diagnostic unit 305 includes a first extraction unit 500, a second extraction unit 501, and a comparison unit 502.

The output recording unit 301 can record, as acceleration data, the acceleration (output signal) measured by the acceleration sensor 101 in the first recording unit 401 or the second recording unit 402 by setting (controlling) the switch

400. Each of the first recording unit 401 and the second recording unit 402 can record the acceleration data for an arbitrary time (period).

In this embodiment, in a state (initial state) in which neither the acceleration sensors 101 to 104 nor the linear motors 105 to 108 fail, for example, immediately after installation (at the time of assembling) of the active anti-vibration table 1, the acceleration data (first signal) is recorded in the first recording unit 401 for an arbitrary time. The state in which neither the acceleration sensors 101 to 104 nor the linear motors 105 to 108 fail indicates a state in which it is considered, that is, compensated that the acceleration sensors 101 to 104 and the linear motors 105 to 108 are normal. Note that the acceleration data recorded in the first recording unit 401 is not limited to actual data, and may be acceleration data obtained from a simulation in an ideal state in which there is no failure location in the active anti-vibration table 1. The arbitrary time may be, for example, a fixed period such as 1 min, or a period during which one substrate is exposed in a case where the active anti-vibration table 1 is used for an exposure apparatus. Next, at the time of operating the active anti-vibration table 1 (in a state in which the active anti-vibration table 1 is used), the switch 400 is switched to always record, as acceleration data (second signal), the acceleration measured by the acceleration sensor 101 in the second recording unit 402. Then, the acceleration data recorded in the first recording unit 401 and the second recording unit 402 are input to the abnormality diagnostic unit 305 to diagnose the presence/absence of an abnormality of the acceleration of the active anti-vibration table 1 (base 100). In this case, since the acceleration data recorded in the first recording unit 401 is reference data, the acceleration data may be recorded again (updated) in accordance with the apparatus state of the active anti-vibration table 1 (for example, in a case where the acceleration sensor 101 is repaired or replaced).

The acceleration data recorded in the first recording unit 401 is input to the first extraction unit 500. The first extraction unit 500 obtains (extracts), as a characteristic amount, an instantaneous value of the acceleration (output signal) or a statistic value such as a maximum value, an average value, or a standard deviation for a predetermined period from the acceleration data input from the first recording unit 401. Similarly, the acceleration data recorded in the second recording unit 402 is input to the second extraction unit 501. The second extraction unit 501 obtains (extracts), as a characteristic amount, an instantaneous value of the acceleration (output signal) or a statistic value such as a maximum value, an average value, or a standard deviation for a predetermined period from the acceleration data input from the second recording unit 402.

Note that the characteristic amount extracted by the first extraction unit 500 and that extracted by the second extraction unit 501 need not be the same. For example, the first extraction unit 500 obtains a maximum value per sec by dividing the acceleration data recorded in the first recording unit 401 at an interval of 1 sec, and calculates the sum of the average value and the standard deviation from the maximum values, thereby setting it as a characteristic amount. On the other hand, the second extraction unit 501 may obtain a maximum value for 1 sec from the acceleration data recorded in the second recording unit 402 and set it as a characteristic amount.

The comparison unit 502 has a function of comparing the acceleration data (first signal) recorded in the first recording unit 401 with the acceleration data (second signal) recorded in the second recording unit 402. In this embodiment, the comparison unit 502 compares the characteristic amount extracted by the first extraction unit 500 with that extracted by the second extraction unit 501, thereby determining (diagnosing) whether the output of the acceleration sensor 101 is normal or abnormal. For example, if the characteristic amount extracted by the second extraction unit 501 is smaller than that extracted by the first extraction unit 500, the comparison unit 502 outputs "0" indicating that the output of the acceleration sensor 101 is normal. On the other hand, if the characteristic amount extracted by the second extraction unit 501 is equal to or larger than that extracted by the first extraction unit 500, the comparison unit 502 outputs "1" indicating that the output of the acceleration sensor 101 is abnormal.

Alternatively, the comparison unit 502 may compare the difference between the characteristic amount extracted by the first extraction unit 500 and that extracted by the second extraction unit 501 with a threshold, thereby determining (diagnosing) whether the output of the acceleration sensor 101 is normal or abnormal. For example, if the difference between the characteristic amount extracted by the first extraction unit 500 and that extracted by the second extraction unit 501 is smaller than the threshold, the comparison unit 502 outputs "0" indicating that the output of the acceleration sensor 101 is normal. On the other hand, if the difference between the characteristic amount extracted by the first extraction unit 500 and that extracted by the second extraction unit 501 is equal to or larger than the threshold, the comparison unit 502 outputs "1" indicating that the output of the acceleration sensor 101 is abnormal.

Figure 5:
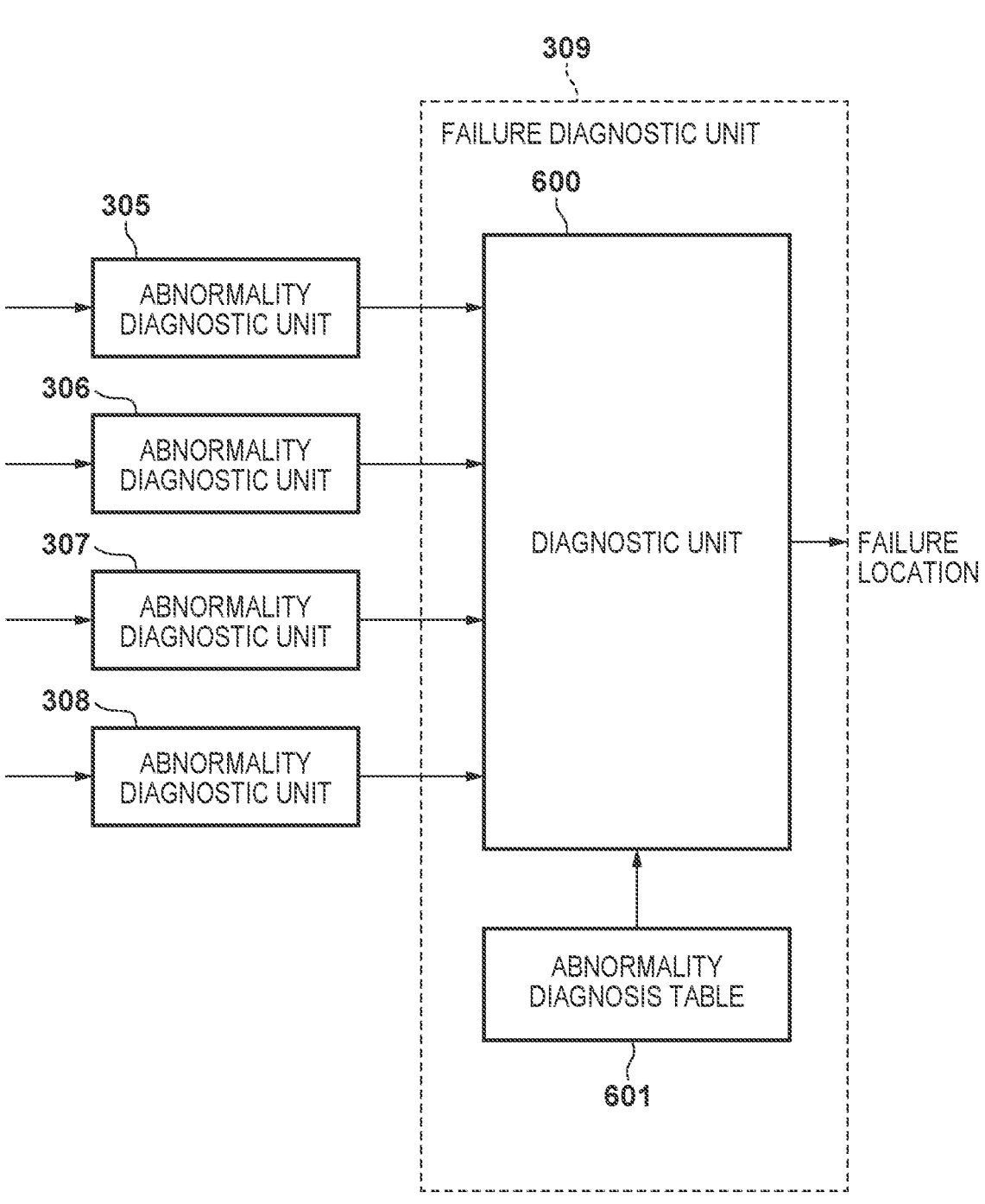
FIG. 5 is a block diagram illustrating the arrangement of a failure diagnostic unit.

The diagnosis result (comparison result) of the comparison unit 502 is input to the failure diagnostic unit 309. FIG. 5 is a block diagram illustrating the arrangement of the failure diagnostic unit 309. The failure diagnostic unit 309 includes a diagnostic unit 600 and an abnormality diagnosis table 601. FIG. 6 is a table showing an example of the abnormality diagnosis table 601. The abnormality diagnosis table 601 is a table formed from information indicating whether the output of each of the acceleration sensors 101 to 104 is normal or abnormal. More specifically, the abnormality diagnosis table 601 is a table showing the correspondence between a failure location and an abnormality diagnosis pattern formed from a binary code including "0" and "1" output from the abnormality diagnostic units 305 to 308. As shown in FIG. 6, in this embodiment, the abnormality diagnosis table 601 is recorded as an abnormality diagnosis pattern (vector) $\vec{b_l}$ for each failure location obtained in advance by an examination.

Processing in the failure diagnostic unit 309 (diagnostic unit 600), that is, processing (diagnostic processing) of diagnosing a failure location of the active anti-vibration table 1 will be described with reference to FIG. 7.

In step S701, the diagnostic unit 600 determines whether at least one of the abnormality diagnostic units 305 to 308 diagnoses the output of the corresponding acceleration sensor to be abnormal (whether at least one of the abnormality diagnostic units 305 to 308 outputs "1" indicating an abnormality). If it is not determined that at least one abnormality diagnostic unit diagnoses the output of the corresponding acceleration sensor to be abnormal (that is, the outputs of the acceleration sensors 101 to 104 are normal), step S701 is repeated. On the other hand, if it is determined that at least one abnormality diagnostic unit diagnoses the output of the corresponding acceleration sensor to be abnormal, the process shifts to step S702.

In step S702, the diagnostic unit 600 obtains, from the outputs of the abnormality diagnostic units 305 to 308, an abnormality diagnosis pattern (vector) $\vec{a}$ formed from information indicating whether the output of each of the acceleration sensors 101 to 104 is normal or abnormal.

In step S703, the diagnostic unit 600 obtains the similarity between the ith abnormality diagnosis pattern $\vec{b_l}$ of the abnormality diagnosis table 601 and the abnormality diagnosis pattern $\vec{a}$ obtained in step S702. The similarity is obtained by, for example, the cosine similarity (cos similarity) given by:

cos similarity $$\left(\vec{a}, \vec{b_l}\right) = \frac{\vec{a} \cdot \vec{b_l}}{|\vec{a}||\vec{b_l}|}$$

In step S704, the diagnostic unit 600 records the similarity obtained in step S703.

In step S705, the diagnostic unit 600 determines whether the similarity has been recorded for all the abnormality diagnosis patterns included in the abnormality diagnosis table 601. If the similarity has been recorded for not all the abnormality diagnosis patterns included in the abnormality diagnosis table 601, steps S703 to S705 are repeated. On the other hand, if the similarity has been recorded for all the abnormality diagnosis patterns included in the abnormality diagnosis table 601, the process shifts to step S706.

In step S706, the diagnostic unit 600 diagnoses (estimates) a failure location of the active anti-vibration table 1 from the acceleration sensors 101 to 104 and the linear motors 105 to 108 based on the similarities recorded in step S704. In other words, a data bus including at least one of a failed acceleration sensor and a failed sensor is specified from the acceleration sensors 101 to 104 and the linear motors 105 to 108 based on the abnormality diagnosis pattern obtained in step S702. For example, the diagnostic unit 600 diagnoses, as a failure location, the device corresponding to the abnormality diagnosis pattern having the highest similarity among all the abnormality diagnosis patterns included in the abnormality diagnosis table 601. Alternatively, the diagnostic unit 600 may diagnose, as a failure location, the device corresponding to each of a plurality of abnormality diagnosis patterns each having the high similarity, for example, a plurality of abnormality diagnosis patterns each having the similarity equal to or larger than a threshold among all the abnormality diagnosis patterns included in the abnormality diagnosis table 601.

According to this embodiment, it is possible to diagnose a failure (failure location) of the acceleration sensor or the linear motor without requiring a new detection unit that detects a failure of the linear motor (actuator). Furthermore, since it is possible to diagnose a failure of the acceleration sensor or the linear motor without stopping the active anti-vibration table 1, it is possible to suppress (prevent) reduction in productivity. Therefore, there can be provided a technique advantageous in diagnosing a failure location of the active anti-vibration table 1 (control apparatus) including the plurality of acceleration sensors (sensors) and the plurality of linear motors (actuators).

Figure 8:
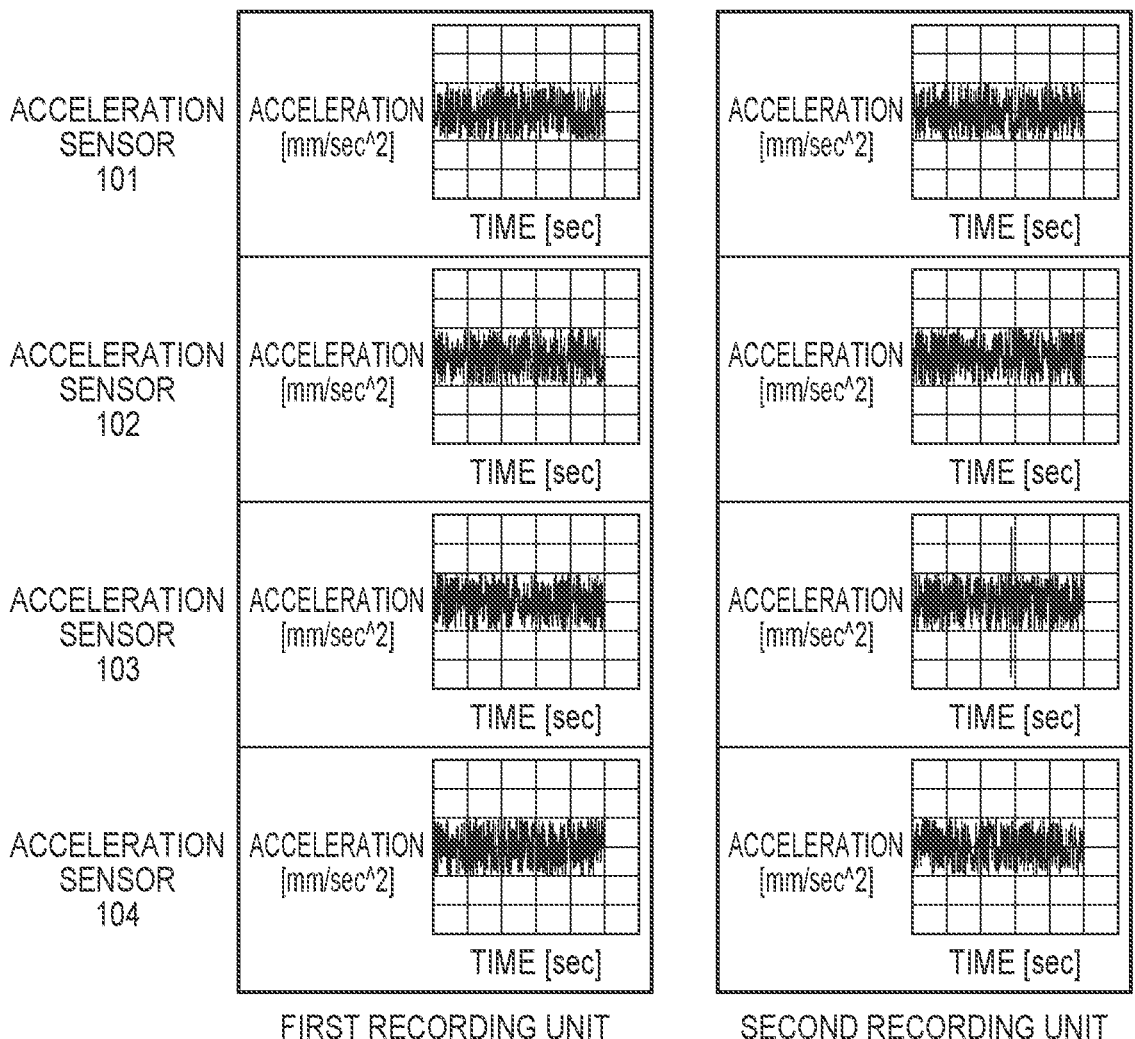
FIG. 8 is a view showing acceleration data recorded in a first recording unit and a second recording unit.

Next, a practical example of the diagnostic processing in the failure diagnostic unit 309 (diagnostic unit 600) will be described. FIG. 8 is a view showing the acceleration data output from the acceleration sensors 101 to 104 and recorded in the first recording unit 401, and the acceleration data output from the acceleration sensors 101 to 104 and recorded in the second recording unit 402. Note that the acceleration data recorded in the second recording unit 402 are acceleration data in a state in which the acceleration sensor 103 among the four acceleration sensors 101 to 104 fails.

The first extraction unit 500 calculates the sum of the average value and the standard deviation of the maximum values obtained by dividing the acceleration data recorded in the first recording unit 401 at an interval of 1 sec, and sets it as a characteristic amount. The second extraction unit 501 sets, as a characteristic amount, a maximum value obtained by dividing the acceleration data recorded in the second recording unit 402 at an interval of 1 sec. In the example shown in FIG. 8, with respect to the acceleration sensors 101, 102, and 104, the characteristic amount extracted by the second extraction unit 501 is smaller than that extracted by the first extraction unit 500. Therefore, each of the abnormality diagnostic units 305, 306, and 308 outputs "0" indicating that the output of each of the acceleration sensors 101, 102, and 104 is normal. On the other hand, with respect to the acceleration sensor 103, the characteristic amount extracted by the second extraction unit 501 is equal to or larger than that extracted by the first extraction unit 500, and thus the abnormality diagnostic unit 307 outputs "1" indicating that the output of the acceleration sensor 103 is abnormal. Therefore, "0", "0", "1", and "0" are output as an abnormality diagnosis pattern from the abnormality diagnostic units 305 to 308, and input to the failure diagnostic unit 309.

The diagnostic unit 600 obtains the similarity between the abnormality diagnosis pattern input from the abnormality diagnostic units 305 to 308 and each of the plurality of abnormality diagnosis patterns included in the abnormality diagnosis table 601 shown in FIG. 6. In this embodiment, the similarity with the abnormality diagnosis pattern $\vec{b}_3$ indicating the acceleration sensor 103 as a failure location among the plurality of abnormality diagnosis patterns included in the abnormality diagnosis table 601 is highest. Therefore, the diagnostic unit 600 diagnoses, as a failure location, the acceleration sensor 103 as a device corresponding to the abnormality diagnosis pattern with the highest similarity.

Figure 9:
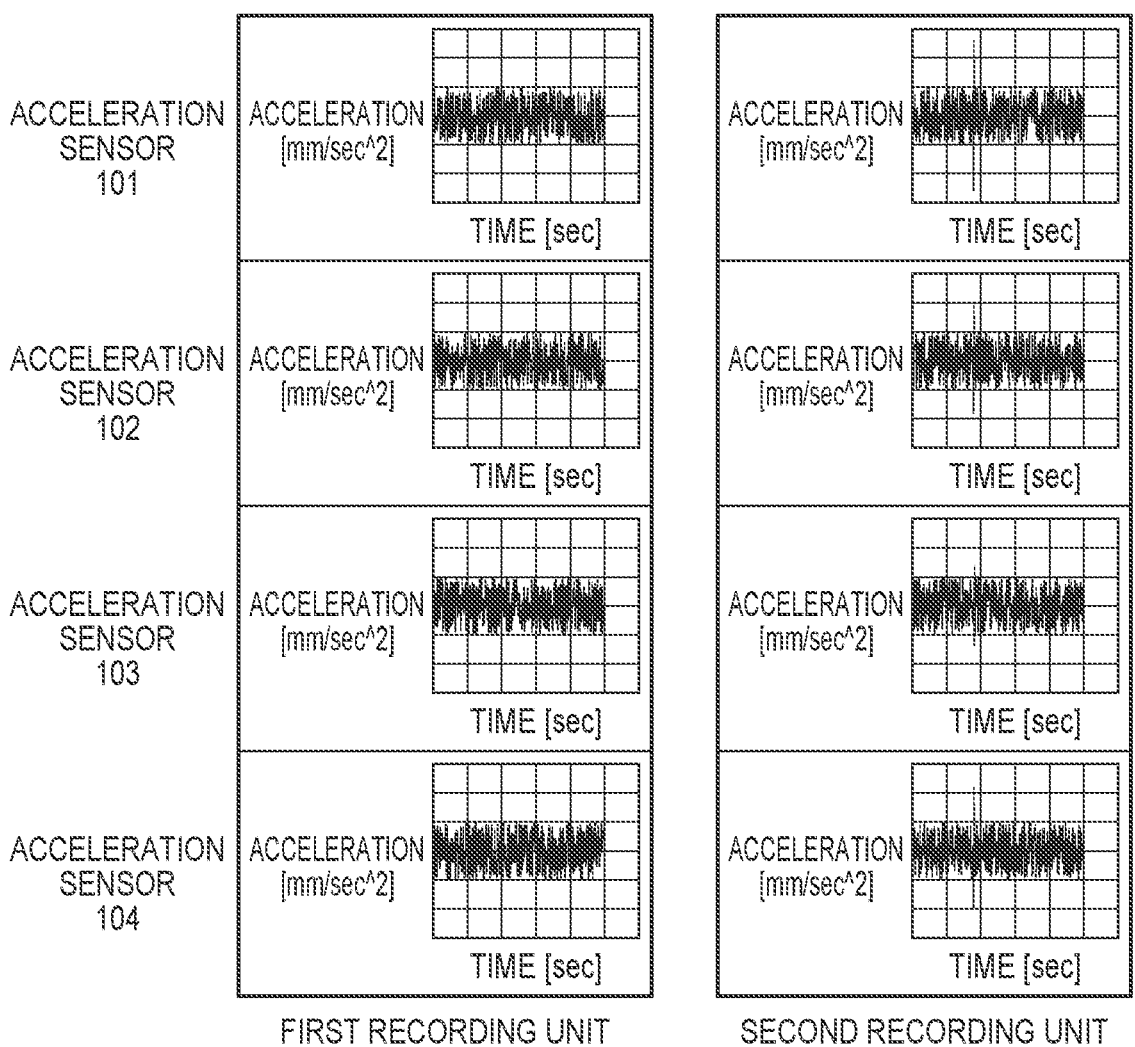
FIG. 9 is a view showing acceleration data recorded in the first recording unit and the second recording unit.

Furthermore, another practical example of the diagnostic processing in the failure diagnostic unit 309 (diagnostic unit 600) will be described. FIG. 9 is a view showing the acceleration data output from the acceleration sensors 101 to 104 and recorded in the first recording unit 401, and the acceleration data output from the acceleration sensors 101 to 104 and recorded in the second recording unit 402. Note that the acceleration data recorded in the second recording unit 402 are acceleration data in a state in which the linear motor 105 among the four linear motors 105 to 108 fails.

In the example shown in FIG. 9, each of the abnormality diagnostic units 305, 306, and 308 outputs "1" indicating that the output of each of the acceleration sensors 101, 102, and 104 is abnormal. On the other hand, the abnormality diagnostic unit 307 outputs "0" indicating that the output of the acceleration sensor 103 is normal. Therefore, "1", "1", "0", and "1" are output as an abnormality diagnosis pattern from the abnormality diagnostic units 305 to 308, and input to the failure diagnostic unit 309.

The diagnostic unit 600 obtains the similarity between the abnormality diagnosis pattern input from the abnormality diagnostic units 305 to 308 and each of the plurality of abnormality diagnosis patterns included in the abnormality diagnosis table 601 shown in FIG. 6. In this embodiment, the similarity with the abnormality diagnosis pattern $\vec{b}_5$ indicating the linear motor 105 as a failure location among the plurality of abnormality diagnosis patterns included in the abnormality diagnosis table 601 is highest. Therefore, the failure diagnostic unit 309 diagnoses, as a failure location, the linear motor 105 as a device corresponding to the abnormality diagnosis pattern with the highest similarity.

In this embodiment, since the acceleration data is divided at an interval of 1 sec to diagnose a failure location of the active anti-vibration table 1, it is assumed that a plurality of acceleration sensors do not fail within 1 sec. Therefore, if a plurality of acceleration sensors fail within 1 sec, a failure location may erroneously be diagnosed. However, since the probability that a plurality of acceleration sensors fail within 1 sec is low, the possibility of erroneously diagnosing a failure location is actually, significantly low. In addition, by dividing the acceleration data at an interval shorter than 1 sec, the possibility of erroneously diagnosing a failure location can be decreased.

Figure 10:
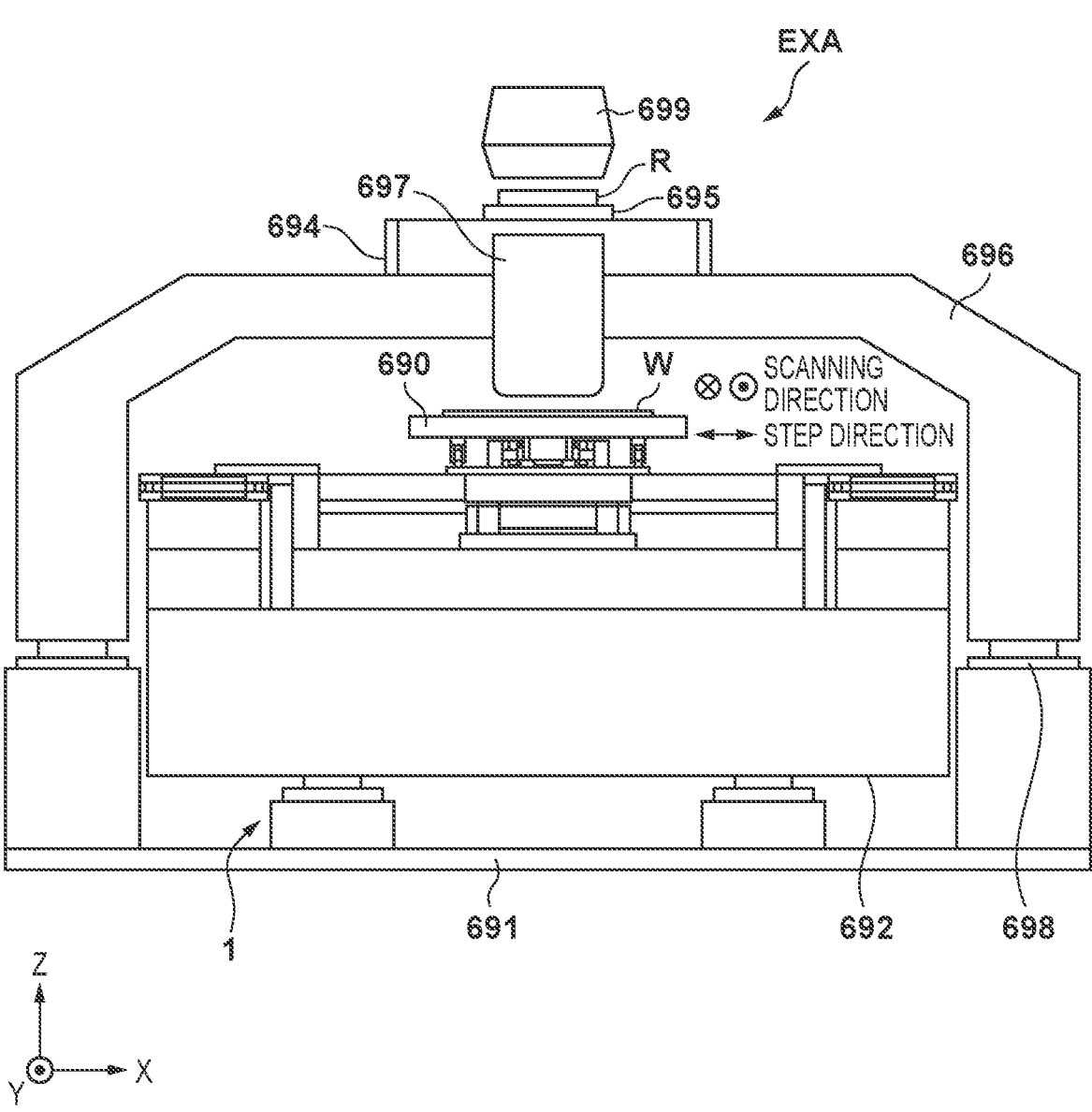
FIG. 10 is a schematic view illustrating configurations of an exposure apparatus according to an aspect of the present invention.

The active anti-vibration table 1 (control apparatus) can be used for an exposure apparatus. FIG. 10 is a schematic view illustrating configurations of an exposure apparatus EXA using the active anti-vibration table 1. The exposure apparatus EXA is, for example, a lithography apparatus that is used for a lithography step of various devices or the like and forms a pattern on a substrate. The exposure apparatus EXA performs exposure processing of exposing a substrate W via an original R and transferring the pattern of the original R to the substrate W. In this embodiment, the exposure apparatus EXA is a scanning exposure apparatus (scanner) that exposes (scans and exposes) the substrate W while relatively scanning the original R and the substrate W in a scanning direction, and transfers the pattern of the original R to the substrate.

As shown in FIG. 10, the exposure apparatus EXA includes a stage base 692, a substrate stage 690, a lens barrel base 696, a damper 698, a projection optical system 697, an illumination optical system 699, an original base 694, and an original stage 695. In this embodiment, a direction perpendicular to the paper surface of FIG. 10 is defined as a scanning direction and a horizontal direction within the paper surface of FIG. 10 is defined as a step direction. A coordinate system is defined in which the scanning direction is set as a Y-axis, a direction intersecting the scanning direction, particularly, the step direction orthogonal to the scanning direction is set as an X-axis, and a direction orthogonal to the X- and Y-axes is set as a Z-axis.

The stage base 692 is supported by a floor 691 via the active anti-vibration table 1. The substrate stage 690 that holds the substrate W is provided on the stage base 692 to be drivable. The lens barrel base 696 is supported by the floor 691 via the damper 698. The projection optical system 697 and the original base 694 are provided in the lens barrel base 696. The original stage 695 that holds the original R is provided on the original base 694 to be drivable (slidable). The illumination optical system 699 is provided above the original stage 695.

In exposure, light emitted from a light source (not shown) illuminates the original R by the illumination optical system 699. The pattern of the original R is projected onto the substrate W by the projection optical system 697. At this time, the original stage 695 and the substrate stage 690 relatively scan the original R and the substrate W in the scanning direction, respectively. The stage base 692 provided with the substrate stage 690 is supported by the active anti-vibration table 1. Therefore, the exposure apparatus EXA can economically provide a device (an article such as a semiconductor device, a magnetic storage medium, or a liquid crystal display device) at high throughput.

An article manufacturing method according to the embodiment of the present invention is favorable in, for example, manufacturing such articles as devices (e.g., semiconductor elements, magnetic storage mediums, and liquid crystal display elements). This manufacturing method includes a process of forming a pattern on a substrate using the exposure apparatus EXP, a process of processing the substrate on which the pattern has been formed, and a process of manufacturing an article from the processed substrate, with use of the exposure apparatus 1. Also, this manufacturing method can include other known processes (oxidization, film formation, vapor deposition, doping, planarization, etching, photoresist stripping, dicing, bonding, packaging, and so forth). Compared to the conventional ones, the article manufacturing method according to the present embodiment is advantageous in at least one of the performance, quality, productivity, and production cost of an article.

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-083264 filed on May 20, 2022, which is hereby incorporated by reference herein in its entirety.

What is claimed is:

1. A method of diagnosing a failure location of a control apparatus for an active anti-vibration table including a plurality of actuators each configured to apply a thrust to a target object, a plurality of sensors each configured to detect a state quantity of the target object, and a controller configured to control the plurality of actuators based on signals output from the plurality of sensors, the method comprising:

recording, during operation of the control apparatus, acceleration data from each of the plurality of sensors in real-time;

extracting characteristic values from the acceleration data using statistical processing over a predetermined time period;

comparing reference characteristic values extracted from acceleration data from each of the plurality of sensors in a state in which the plurality of actuators and the plurality of sensors are considered to be normal with the extracted characteristic values from the acceleration data recorded during operation of the control apparatus;

generating an abnormality diagnosis pattern based on the comparison, wherein the abnormality diagnosis pattern comprises a vector indicating normal or abnormal status for each sensor;

calculating similarity measures between the generated abnormality diagnosis pattern and predetermined failure patterns stored in an abnormality diagnosis table; and diagnosing, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

2. The method according to claim 1, wherein in the generating, the abnormality diagnosis pattern is formed from binary information indicating whether the output of each of the plurality of sensors is normal or abnormal obtained by comparing the reference characteristic values with the extracted characteristic values, and in the diagnosing, the device is specified from the plurality of actuators and the plurality of sensors based on the similarity measures between the generated abnormality diagnosis pattern and the predetermined failure patterns.

3. The method according to claim 1, further including determining whether the output of each of the plurality of sensors is normal or abnormal by comparing a characteristic value extracted from a respective sensor of the plurality of sensors with a corresponding reference characteristic value.

4. The method according to claim 3, wherein the characteristic values include one of an instantaneous value of the signal output from each of the plurality of sensors and a statistic value for a predetermined period.

5. The method according to claim 1, further including determining whether the output of each of the plurality of sensors is normal or abnormal by comparing a difference between a characteristic value extracted from a respective sensor of the plurality of sensors and a corresponding reference characteristic against a predetermined threshold.

6. The method according to claim 1, wherein in the diagnosing, the device is specified from the plurality of actuators and the plurality of sensors by comparing the generated abnormality diagnosis pattern with the abnormality diagnosis table indicating a correspondence between failure locations and the predetermined failure patterns formed from the information indicating whether the output of each of the plurality of sensors is normal or abnormal.

7. The method according to claim 1, wherein the reference characteristic values are obtained from acceleration data recorded from each of the plurality of sensors in an initial state at the time of assembling the control apparatus.

8. A diagnostic apparatus for diagnosing a failure location of a control apparatus for an anti-vibration table including a plurality of actuators each configured to apply a thrust to a target object, a plurality of sensors each configured to detect a state quantity of the target object, and a controller configured to control the plurality of actuators based on signals output from the plurality of sensors, the apparatus comprising:

a recording unit configured to record, during operation of the control apparatus, acceleration data from each of the plurality of sensors in real-time;

an extracting unit configured to extract characteristic values from the acceleration data using statistical processing over a predetermined time period;

a comparison unit configured to compare reference characteristic values extracted from acceleration data from each of the plurality of sensors in a state in which the plurality of actuators and the plurality of sensors are considered to be normal with the extracted characteristic values from the acceleration data recorded during operation of the control apparatus;

a generating unit configured to generate an abnormality diagnosis pattern based on the comparison, wherein the abnormality diagnosis pattern comprises a vector indicating normal or abnormal status for each sensor;

a calculating unit configured to calculate similarity measures between the generated abnormality diagnosis pattern and predetermined failure patterns stored in an abnormality diagnosis table; and a diagnostic unit configured to diagnose, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

9. A control apparatus for controlling an anti-vibration table, comprising:

a plurality of actuators each configured to apply a thrust to the anti-vibration table;

a plurality of sensors each configured to detect a state quantity of the anti-vibration table;

a controller configured to control the plurality of actuators based on signals output from the plurality of sensors;

a recording unit configured to record, during operation of the control apparatus, the signals output from the plurality of sensors in real-time;

an extraction unit configured to extract characteristic values from the recorded signals using statistical processing over a predetermined time period;

a comparison unit configured to compare reference characteristic values extracted from signals output from the plurality of sensors in a state in which the plurality of actuators and the plurality of sensors are considered to be normal with the extracted characteristic values from the signals recorded during operation of the control apparatus; and a generating unit configured to generate an abnormality diagnosis pattern based on the comparison, wherein the abnormality diagnosis pattern comprises a vector indicating normal or abnormal status for each sensor;

a calculating unit configured to calculate similarity measures between the generated abnormality diagnosis pattern and predetermined failure patterns stored in an abnormality diagnosis table; and a diagnostic unit configured to diagnose, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

10. A lithography apparatus for forming a pattern on a substrate, comprising:

an anti-vibration table configured to support a base provided with a stage that holds the substrate;

a plurality of actuators each configured to apply a thrust to the anti-vibration table;

a plurality of sensors each configured to detect a state quantity of the anti-vibration table;

a controller configured to control the plurality of actuators based on signals output from the plurality of sensors;

a recording unit configured to record, during operation of the control apparatus, the signals output from the plurality of sensors in real-time;

an extraction unit configured to extract characteristic values from the recorded signals using statistical processing over a predetermined time period;

a comparison unit configured to compare reference characteristic values extracted from signals output from the plurality of sensors in a state in which the plurality of actuators and the plurality of sensors are considered to be normal with the extracted characteristic values from the signals recorded during operation of the control apparatus; and a generating unit configured to generate an abnormality diagnosis pattern based on the comparison, wherein the abnormality diagnosis pattern comprises a vector indicating normal or abnormal status for each sensor;

a calculating unit configured to calculate similarity measures between the generated abnormality diagnosis pattern and predetermined failure patterns stored in an abnormality diagnosis table; and a diagnostic unit configured to diagnose, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

11. An article manufacturing method comprising:

forming a pattern on a substrate using a lithography apparatus defined in claim 10; and manufacturing an article by processing the substrate on which the pattern is formed in the forming.

12. A non-transitory computer-readable storage medium storing a program for causing a computer to execute a method of diagnosing a failure location of a control apparatus for an anti-vibration table including a plurality of actuators each configured to apply a thrust to a target object, a plurality of sensors each configured to detect a state quantity of the target object, and a controller configured to control the plurality of actuators based on signals output from the plurality of sensors, the program causing the computer to execute:

recording, during operation of the control apparatus, acceleration data from each of the plurality of sensors in real-time;

extracting characteristic values from the acceleration data using statistical processing over a predetermined time period;

comparing reference characteristic values extracted from acceleration data from each of the plurality of sensors in a state in which the plurality of actuators and the plurality of sensors are considered to be normal with the extracted characteristic values from the acceleration data recorded during operation of the control apparatus;

generating an abnormality diagnosis pattern based on the comparison, wherein the abnormality diagnosis pattern comprises a vector indicating normal or abnormal status for each sensor;

calculating similarity measures between the generated abnormality diagnosis pattern and predetermined failure patterns stored in an abnormality diagnosis table; and diagnosing, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

13. A method of diagnosing a failure location of a control apparatus for an anti-vibration table including a plurality of actuators each configured to apply a thrust to a target object, a plurality of sensors each configured to detect a state quantity of the target object, and a controller configured to control the plurality of actuators based on signals output from the plurality of sensors, the method comprising:

recording, during operation of the control apparatus, data related to the state quantity of the target object from each of the plurality of sensors in real-time;

extracting characteristic values from the data using statistical processing over a predetermined time period;

comparing reference characteristic values extracted from data related to the state quantity of the target object from each of the plurality of sensors in a state in which the plurality of actuators and the plurality of sensors are considered to be normal with the extracted characteristic values from the data recorded during operation of the control apparatus;

generating an abnormality diagnosis pattern based on the comparison, wherein the abnormality diagnosis pattern comprises a vector indicating normal or abnormal status for each sensor;

calculating similarity measures between the generated abnormality diagnosis pattern and predetermined failure patterns stored in an abnormality diagnosis table; and diagnosing, as the failure location, a device including at least one of a failed actuator and a failed sensor among the plurality of actuators and the plurality of sensors based on the calculated similarity measures, wherein the diagnosing is performable during continuous operation of the control apparatus without stopping the anti-vibration table.

* * * * *